United States Patent [19]

Addis

[11] 4,390,852

[45] Jun. 28, 1983

[54] BUFFER AMPLIFIER

[75] Inventor: John L. Addis, Beaverton, Oreg.

[73] Assignee: Tektronix, Inc., Beaverton, Oreg.

[21] Appl. No.: 253,471

[22] Filed: Apr. 13, 1981

[51] Int. Cl.$^3$ ............................ H03F 3/16; H03F 3/26
[52] U.S. Cl. .................................... 330/300; 330/267; 330/156
[58] Field of Search ................ 330/156, 263, 267, 300

[56] References Cited

U.S. PATENT DOCUMENTS 3,562,656  2/1971  Bateman ............................. 330/277

Primary Examiner—James B. Mullins
Assistant Examiner—Gene Wan
Attorney, Agent, or Firm—George T. Noe

[57] ABSTRACT

A buffer amplifier suitable for use as an input amplifier for an oscilloscope comprises a hybrid FET-bipolar transistor source follower input stage and a complementary emitter follower output stage. Both the input and output stages include bootstraps to eliminate thermal transient response aberrations, to increase input impedance, and to maintain standing current in the output stage. Other attributes include a very short response time for high bandwidth operation, and high linearity.

5 Claims, 1 Drawing Figure

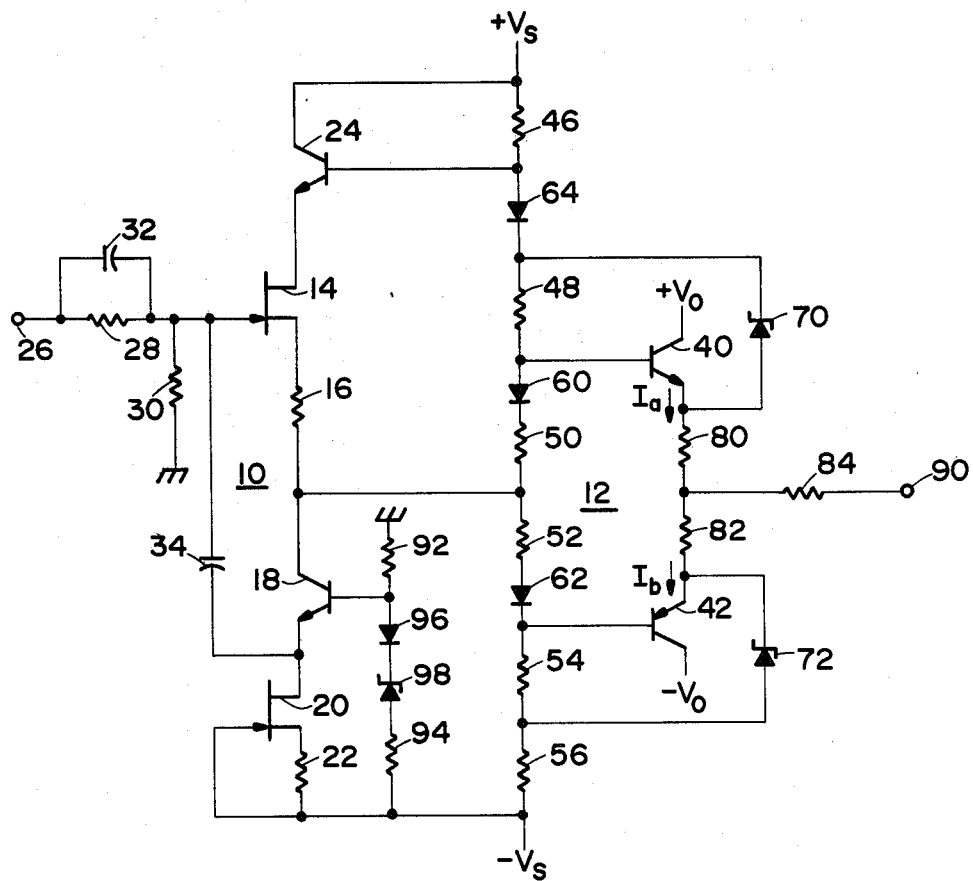

BUFFER AMPLIFIER

BACKGROUND OF THE INVENTION

The present invention relates to a buffer amplifier suitable for use as an input amplifier for an oscilloscope. The requirements for such an amplifier include a high input impedance to minimize loading the circuit being tested, high linearity and low thermal distortion to maintain signal accuracy and fidelity, a low output impedance, and a high bandwidth capability. Conventional buffer amplifier circuits employ field-effect transistor (FET) input stages to provide high input impedance, and a single bipolar transistor emitter follower output stage. However, such conventional circuits exhibit substantial signal-caused thermal transient response aberations and nonlinearity. Also, because of the limitations of FET transconductance, conventional designs suffer a loss in high frequency response.

SUMMARY OF THE INVENTION

In accordance with the present invention, an improved buffer amplifier comprises a hybrid FET-bipolar transistor source follower input stage and a complementary emitter follower amplifier output stage in which the response time is very short and input bias current is substantially zero. Both the input and output stages contain bootstraps to eliminate thermal transient-response aberations, to increase input impedance, and to maintain standing current in the output stage. High linearity is inherent in the preferred embodiment because the gain is independent of the input signal. The improved buffer amplifier of the present invention is especially useful as the input stage of the vertical amplifier of an oscilloscope, or as an active probe because passive components may be added to provide an attenuated input and transmission-line reverse termination without compromising any of the above-mentioned attributes of the buffer amplifier itself.

It is therefore one object of the present invention to provide an improved buffer amplifier having a wide bandwidth capability, low thermal distortion, and high linearity.

It is another object of the present invention to provide an improved buffer amplifier having an FET source-follower input stage and a complementary-amplifier emitter-follower output stage in which the net circuit response time is very short.

It is a further object of the present invention to provide an improved buffer amplifier in which the output impedance and circuit gain are substantially independent of the input signal.

It is an additional object of the present invention to provide an improved buffer amplifier in which passive impedance elements may be added to the input and output terminals without compromising the performance of the amplifier.

Other objects and advantages will become apparent to those having ordinary skill in the art from consideration of the following description taken in conjunction with the accompanying drawing.

DRAWING

The single FIGURE is a schematic diagram of the preferred embodiment according to the present invention.

DETAILED DESCRIPTION OF PREFERRED EMBODIMENT

The buffer amplifier of the present invention comprises generally an input stage 10 and an output stage 12. The input stage 10 includes a field-effect transistor (FET) 14 connected as a source follower amplifier having its source connected through a resistor 16 to the collector of a bipolar transistor 18 connected as a common-base amplifier. The emitter of transistor 18 is connected to a constant current source comprising a second FET 20 and a current-setting resistor 22. The drain of the input FET is connected through a bipolar transistor 24 to a suitable source of positive supply voltage $+V_s$. The gate of FET 14 is coupled to an input terminal 26 via an optional attenuator consisting of voltage divider resistors 28 and 30, and capacitors 32 and 34. The basic circuit configuration of source-follower FET 14, bipolar transistor 18, and current source FET 20 is shown and described in U.S. Pat. No. 3,562,656, which is assigned to the assignee of the present invention.

The output stage 12 includes a complementary emitter follower amplifier comprising emitter-coupler transistors 40 and 42 of opposite polarity types serially disposed between suitable sources of output supply voltages $+V_0$ and $-V_0$. The bases of these two transistors are connected into a divider string of biasing elements comprising resistors 46-56 and diodes 60-64 which are connected in series between the supply voltage sources $+V_s$ and $-V_s$. The diodes effectively cancel the temperature coefficients of their respective associated transistors, as is well known in the art. A pair of bootstrapping Zener diodes 70 and 72 are connected from the divider string to the emitters of the output transistors 40 and 42, respectively. A pair of resistors 80 and 82 is connected in series between the emitters of transistors 40 and 42, and the junction of these two resistors is connected via another resistor 84 to an output terminal 90.

Bias voltage for transistor 18 in the input stage 10 is provided by a voltage divider connected between ground and the negative supply source $-V_s$, the voltage divider comprising resistors 92 and 94, diode 96, and Zener diode 98. The component values are selected such that the voltage drop across resistor 94 is equal to the voltage drop across resistor 80, while diode 96 and Zener diode 98 match diode 64 and Zener diode 70, respectively, with the net result of establishing a voltage across (drain to source) FET 20 which is equal to the voltage across (drain to source) FET 14.

In operation, the input terminal 26 is connected to a signal source, which may be, for example, a test point in an external circuit. The gate of FET 14 provides a high impedance to minimize loading the signal source. Of course, if the optional attenuator 28-30-32-34 is employed, the values of these components will establish the input impedance; however, it is typical to use components which will represent one megohm or more. The advantage in utilizing such an attenuator is that if the expected signal is high in peak-to-peak amplitude, it may be divided down to a suitable level, as is well known in the art. FET 14 operates as a source follower with the signal being delivered via resistor 16 to the junction of resistors 50 and 52 to drive the bases of transistors 40 and 42. Transistor 24, connected to the drain of the input FET 14 and driven by the signal generated at the emitter of transistor 40, effectively bootstraps the FET 14 to eliminate thermal transient-response aberations and distortion. Transistors 24 also serves to reduce the input capacitance because the drain voltage of FET 14 changes in unison with the signal voltage at the FET 14 gate, eliminating the voltage necessary to charge the gate-to-drain capacitance of FET 14.

In the output stage, diodes 60 and 62, which may suitably be diode-connected transistors, are in parallel with the base-to-emitter junctions of the output transistors 40 and 42. The effect of this arrangement is to maintain a substantially constant emitter-to-emitter voltage of the output transistors, and to cancel the effects of the temperature dependent mechanisms of the transistor junctions. The bootstrapping Zener diodes 70 and 72 maintain a substantially constant voltage across resistors 48 and 54, thereby maintaining a substantially constant bias current for the output stage, even under dynamic signal conditions. In addition to providing increased input impedance for the output stage, Zener diodes 70 and 72 permit the standing current of output transistors 40 and 42 to be determined by the values of resistors 80 and 82. The output stage hereinabove described exhibits a very short response time and little or no input bias current, and therefore facilitates a high frequency response and is suitable for high bandwidth operation. A commercial realization of the preferred embodiment is intended for use in a 2-gigahertz active probe.

Q40 and Q42 are (or can be) in thermal balance, i.e., Q40 and Q42 can be biased such that a signal input will cause identical changes in power in both Q40 and Q42 simultaneously. Thus the temperature changes in Q40 and Q42 are identical and result in identical current changes in these devices, resulting in no net change in output current or voltage. It is this mechanism which results in low thermally produced transient response aberrations.

High linearity for the circuit is provided by the following mechanism: neglecting resistors 80, 82, and 84, the output impedance $R_0$ of the circuit is $KT/qI_a$ in parallel with $KT/I_b$, where K is Boltzmann's constant, T is absolute temperature in degrees Kelvin, q is the charge on an electron, and $I_a$ and $I_b$ are the emitter currents of transistors 40 and 42, respectively. The sum $(I_a+I_b)$ is a constant value, and any difference between the two currents is, of course, the load current conducted through resistor 84. The output conductance $$G_0=1/R_0=qI_a/KT+qI_b/KT,$$

and thus the output impedance is $$R_0=KT/q(I_a+I_b)^{-1}.$$

Because $(I_a+I_b)$ is constant, $R_0$ is independent of the input signal, and consequently the gain of the buffer amplifier stage is largely independent of signal.

Resistors 80, 82, and 84, together with the combined impedances looking into the emitters of transistors 40 and 42 provide reverse termination for driving a transmission line, such as a coaxial cable connected between output terminal 90 and a preamplifier stage of an associated oscilloscope.

While I have shown and described the preferred embodiment of my invention, it will be apparent to those skilled in the art that many changes and modifications may be made without departing from my invention in its broader aspects.

What I claim as being novel is:

1. A buffer amplifier, comprising:
a source followr input stage comprising a field-effect transistor having a gate connectable to a signal source;
a complementary emitter follower output stage comprising an emitter-coupled pair of transistors wherein the bases thereof are coupled to the source of said field-effect transistor;
bias means for providing a substantially constant bias current for said emitter-coupled pair of transistors, said bias means including first means for bootstrapping the emitters of said emitter-coupled pair of transistors; and
second means for bootstrapping the drain of said field-effect transistor,
wherein both of said first and second bootstrapping means are driven by the output of said source follower input stage.

2. An amplifier in accordance with claim 1 wherein said input stage further comprises a transistor, the collector of which is coupled to the source of said field-effect transistor, the base of which is connected to a bias voltage, and the emitter of which is coupled to a current source.

3. An amplifier in accordance with claim 1 wherein said bias means comprises a plurality of voltage-dropping elements serially disposed between a source of positive supply voltage and a source of negative supply voltage including at least a pair of diodes connected between the bases of said emitter-coupled transistors.

4. An amplifier in accordance with claim 1 wherein said first bootstrapping means comprises a pair of constant voltage elements.

5. An amplifier in accordance with claim 1 wherein said second bootstrapping means comprises a transistor, the base of which is coupled to said bias means and the emitter of which is coupled to the drain of said field-effect transistor.

* * * * *